United States Patent
Kang et al.

(10) Patent No.: US 10,680,114 B2
(45) Date of Patent: Jun. 9, 2020

(54) THIN FILM TRANSISTOR, METHOD OF MANUFACTURING THE SAME AND LIQUID CRYSTAL DISPLAY APPARATUS HAVING THE SAME

(71) Applicant: Samsung Display Co., Ltd., Yongin-si (KR)

(72) Inventors: Su-Hyoung Kang, Seoul (KR); Hyun-Gue Kim, Yongin-si (KR); Jong-Jun Baek, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 25 days.

(21) Appl. No.: 15/071,182

(22) Filed: Mar. 15, 2016

(65) Prior Publication Data

US 2016/0380113 A1    Dec. 29, 2016

(30) Foreign Application Priority Data

Jun. 23, 2015 (KR) .................. 10-2015-0089056

(51) Int. Cl.
*H01L 29/786* (2006.01)
*H01L 29/66* (2006.01)
(Continued)

(52) U.S. Cl.
CPC .. *H01L 29/78678* (2013.01); *G02F 1/134309* (2013.01); *H01L 21/02694* (2013.01);
(Continued)

(58) Field of Classification Search
CPC ......... H01L 29/78678; H01L 21/02694; H01L 29/78696; H01L 27/1222; H01L 29/66765; G02F 1/134309
See application file for complete search history.

(56) References Cited

U.S. PATENT DOCUMENTS 5,517,037 A * 5/1996 Yamamoto .............. C03C 17/22
136/258
7,585,749 B2 9/2009 Hebras
(Continued)

FOREIGN PATENT DOCUMENTS

| KR | 10-2008-0074515 | 8/2008 |
| KR | 10-2011-0062300 | 6/2011 |
| WO | 2011/142073 | 11/2011 |

OTHER PUBLICATIONS

John Robertson, "Deposition Mechanism of Hydrogenated Amorphous Silicon", Journal of Applied Physics, Mar. 1, 2000, pp. 2608-2617, vol. 87, No. 5.
(Continued)

*Primary Examiner* — Michael H Caley
*Assistant Examiner* — Mariam Qureshi
(74) *Attorney, Agent, or Firm* — H.C. Park & Associates, PLC

(57) ABSTRACT

A thin film transistor includes a substrate, a gate electrode disposed on the substrate, an active pattern disposed on the gate electrode, a source electrode electrically coupled to the active pattern and a drain electrode electrically coupled to the active pattern. The active pattern includes a first channel layer overlapping the source electrode and the drain electrode and a second channel layer overlapping the gate electrode. The second channel layer includes a plurality of high electron mobility regions. An electron mobility of each of the high electron mobility regions is greater than an electron mobility of the first channel layer.

17 Claims, 15 Drawing Sheets

(51) Int. Cl.
*H01L 21/02* (2006.01)
*H01L 27/12* (2006.01)
*G02F 1/1343* (2006.01)

(52) U.S. Cl.
CPC .... *H01L 27/1222* (2013.01); *H01L 29/66765* (2013.01); *H01L 29/78669* (2013.01); *H01L 29/78696* (2013.01)

(56) References Cited

U.S. PATENT DOCUMENTS

| | | | |
|---|---|---|---|
| 8,558,323 B2 | 10/2013 | Kim et al. | |
| 8,598,584 B2 | 12/2013 | Nagai et al. | |
| 2001/0028099 A1* | 10/2001 | Sato | H01L 27/1108 257/536 |
| 2003/0183876 A1* | 10/2003 | Takafuji | H01L 21/76254 257/347 |
| 2006/0148208 A1 | 7/2006 | Popov et al. | |
| 2006/0258061 A1* | 11/2006 | Jung | H01L 27/12 438/149 |
| 2010/0244185 A1* | 9/2010 | Takafuji | H01L 21/76254 257/507 |
| 2012/0097209 A1 | 4/2012 | Huang et al. | |
| 2015/0108454 A1* | 4/2015 | Kim | H01L 29/7869 257/40 |
| 2015/0228782 A1* | 8/2015 | Lin | H01L 29/785 257/24 |
| 2016/0190341 A1* | 6/2016 | Fang | H01L 29/78645 257/72 |
| 2017/0162709 A1* | 6/2017 | Nodera | H01L 29/78663 |
| 2018/0097120 A1* | 4/2018 | Ishida | H01L 29/786 |

OTHER PUBLICATIONS

Yu. M. Pokotilo, et al., "Formation of Hydrogen Donors in Proton-Implanted Epitaxial Silicon", Inorganic Materials, 2009, pp. 1205-1209, vol. 45, No. 11.

George C. Yu, "Hydrogen ion diffusion coefficient of a hydrogenated amorphous silicon thin film", Journal of Materials Chemistry, Feb. 21, 2003, pp. 841-843, vol. 13.

* cited by examiner

THIN FILM TRANSISTOR, METHOD OF MANUFACTURING THE SAME AND LIQUID CRYSTAL DISPLAY APPARATUS HAVING THE SAME

CROSS-REFERENCE TO RELATED APPLICATION

This application claims priority from and the benefit of Korean Patent Application No. 10-2015-0089056, filed on Jun. 23, 2015, which is hereby incorporated by reference for all purposes as if fully set forth herein.

BACKGROUND

Field

Exemplary embodiments relate to a thin film transistor. More particularly, example embodiments relate to a thin film transistor for liquid crystal display apparatus and a method of manufacturing the thin film transistor.

Discussion of the Background

Generally, a liquid crystal display apparatus has a liquid crystal layer between a lower substrate and an upper substrate. The liquid crystal display apparatus displays an image by controlling amount of light which passes the substrates according to alignment of the liquid crystal. The liquid crystal display apparatus has a light source such as a backlight unit to supply light to a liquid crystal display panel. Light from the light source transfers to the liquid crystal display panel which includes the substrates and the liquid crystal layer.

The lower substrate may include a plurality of pixels, a switching element which is electrically coupled to the pixels, and gate and data lines electrically coupled to the switching element. The switching element may be a thin film transistor.

In a conventional amorphous silicon transistor, a channel includes amorphous silicon only such that the electron mobility of the amorphous silicon transistor is about 1 $cm^2/V_s$. A thin film transistor with improved electron mobility and a liquid crystal display apparatus with such a thin film transistor are needed.

The above information disclosed in this Background section is only for enhancement of understanding of the background of the inventive concept, and, therefore, it may contain information that does not form the prior art that is already known in this country to a person of ordinary skill in the art.

SUMMARY

Accordingly, the inventive concept is provided to substantially obviate one or more problems due to limitations and disadvantages of the related art.

Additional aspects will be set forth in the detailed description which follows, and, in part, will be apparent from the disclosure, or may be learned by practice of the inventive concept.

Some example embodiments provide a thin film transistor capable of improving electron mobility.

Some example embodiments provide a liquid crystal display apparatus including the thin film transistor Some example embodiments provide a method of a thin film transistor capable of improving electron mobility.

According to example embodiments, a thin film transistor includes a substrate, a gate electrode disposed on the substrate, an active pattern disposed on the gate electrode, a source electrode electrically coupled to the active pattern and a drain electrode electrically coupled to the active pattern. The active pattern includes a first channel layer overlapping the source electrode and the drain electrode and a second channel layer overlapping the gate electrode. The second channel layer includes a plurality of high electron mobility regions. An electron mobility of each of the high electron mobility regions is greater than an electron mobility of the first channel layer.

In example embodiments, the high electron mobility regions may be spaced apart from each other.

In example embodiments, each of the high electron mobility regions may include polysilicon.

In example embodiments, the second channel layer may further include amorphous silicon. Each of the high electron mobility regions may be surrounded by the amorphous silicon.

In example embodiments, a diameter of each of the high electron mobility regions may be within a range of about 1 nm to about 10 nm.

In example embodiments, a hydrogen content of each of the high electron mobility regions may be greater than a hydrogen content of the first channel layer.

In example embodiments, a top surface and a side surface of the second channel layer may be covered by the first channel layer.

In example embodiments, the active pattern is disposed between the source/drain electrode and the gate electrode.

According to example embodiments, a liquid crystal display apparatus includes a first substrate, a second substrate and a liquid crystal layer. The first substrate includes a gate electrode, an active pattern disposed on the gate electrode, a source electrode electrically coupled to the active pattern, a drain electrode electrically coupled to the active pattern and a pixel electrode electrically coupled to the drain electrode. The second substrate is opposite to the first substrate. The liquid crystal layer is disposed between the first and second substrates. The active pattern includes a first channel layer disposed between each of the source electrode and the drain electrode and the gate electrode; and a second channel layer disposed between the gate electrode and the first channel layer. The second channel layer includes a plurality of high electron mobility regions. An electron mobility of each of the high electron mobility regions is greater than an electron mobility of the first channel layer.

According to example embodiments, in a method of manufacturing a thin film transistor, a gate electrode is formed on a substrate. A gate insulation layer is formed on the gate electrode. An active layer and a data metal layer are sequentially formed on the gate insulation layer. A first photoresist pattern is formed on the data metal layer. The data metal layer is patterned into a data metal pattern, and the active layer is patterned into a preliminary active pattern using the first photoresist pattern as an etch stop layer. A second photoresist pattern is formed by partially removing the first photoresist pattern. A source electrode and a drain electrode are formed by patterning the data metal pattern using the second photoresist pattern as an etch stop layer. An active pattern is formed by performing a hydrogen ion beam implantation process and an annealing process at the preliminary active pattern. The active pattern includes a first channel layer and a second channel layer. The second channel layer includes a plurality of high electron mobility regions. An electron mobility of each of the high electron mobility regions is greater than an electron mobility of the first channel layer.

In example embodiments, performing the hydrogen ion beam implantation process further comprises, accelerating a hydrogen ion beam within a range of about 10 keV to about 30 keV, and the implanting hydrogen ion beam at the preliminary active pattern.

In example embodiments, performing the annealing process further comprises, annealing the preliminary active pattern within a range of about 250 degree Celsius to about 300 degree Celsius.

In example embodiments, an insulation layer covering the preliminary active pattern, the source electrode and the drain electrode may be further formed.

According to the thin film transistor, the method of manufacturing the same and the liquid crystal display apparatus having the same, the thin film transistor having high electron mobility can be manufactured.

Electric characteristic of the thin film transistor may be enhanced, and decreasing the defective ratio.

Further, a hydrogen ion beam implantation process and an annealing process may be only added to a conventional amorphous silicon transistor manufacturing process to manufacture the thin film transistor according to example embodiments, increasing productivity and process efficiency.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

Illustrative, non-limiting example embodiments will be more clearly understood from the following detailed description taken in conjunction with the accompanying drawings.

DETAILED DESCRIPTION

Figure 1:
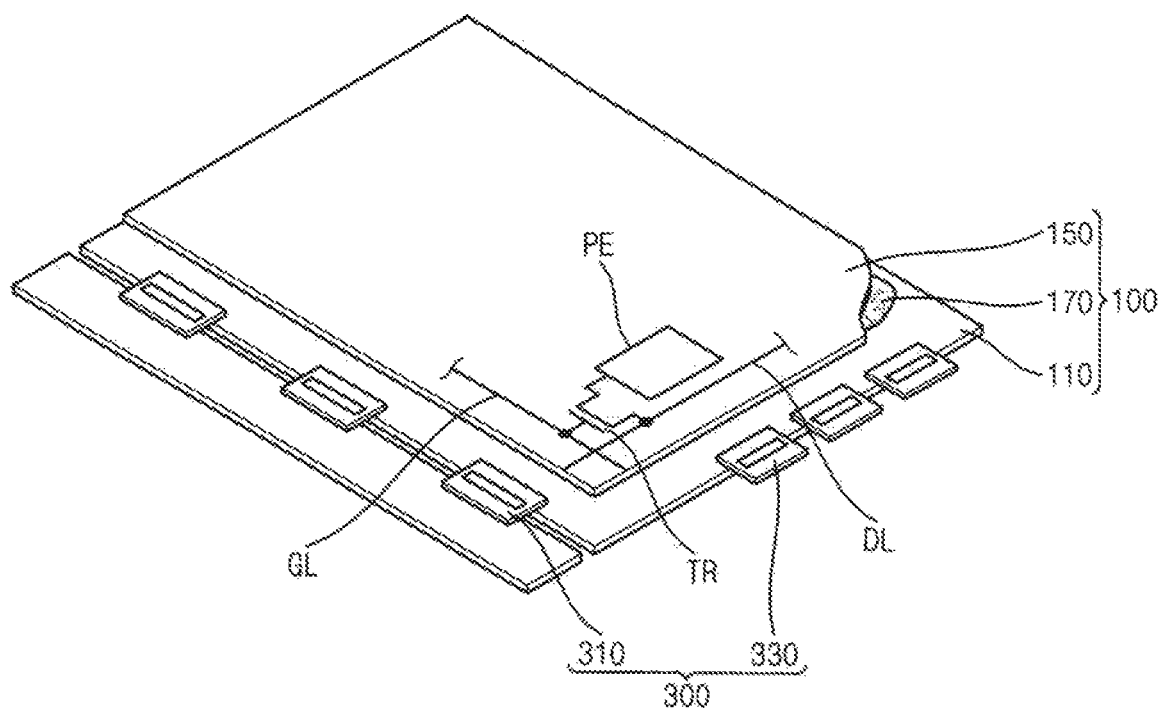
FIG. 1 is a perspective view illustrating a liquid crystal display apparatus according to an example embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
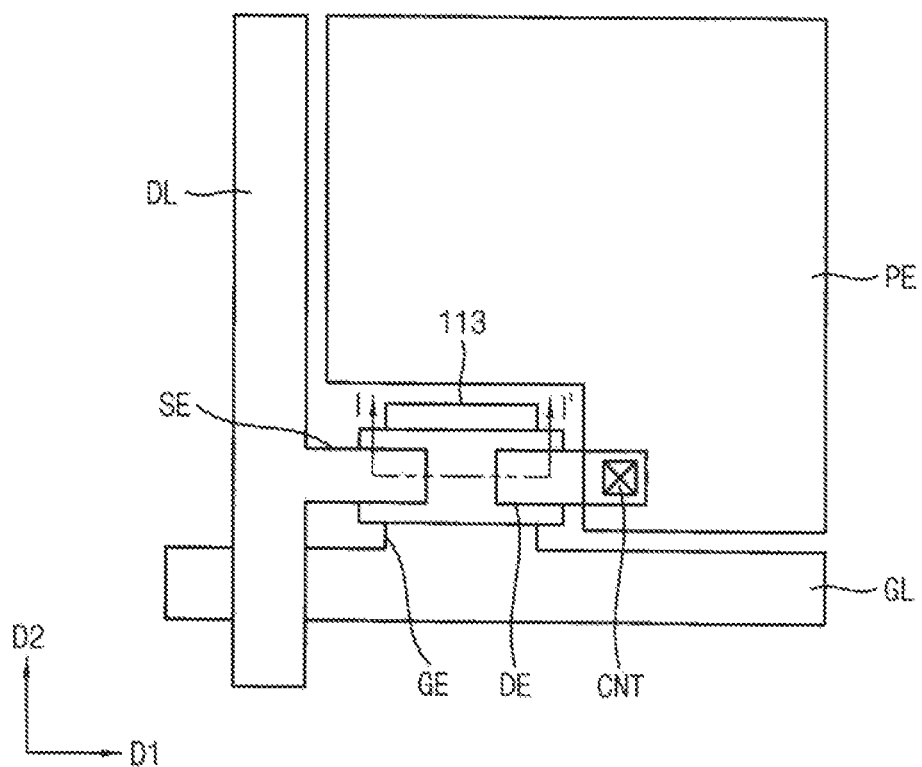
FIG. 2 is an enlarged plan view partially illustrating the liquid crystal display apparatus of FIG. 1.
Figure 3:
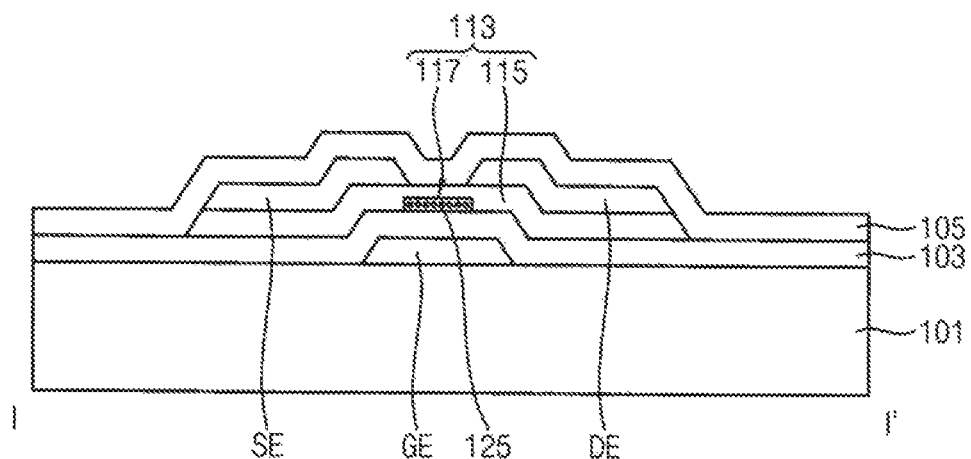
FIG. 3 is a cross-sectional view cut along the line I-I'.
Figure 4:
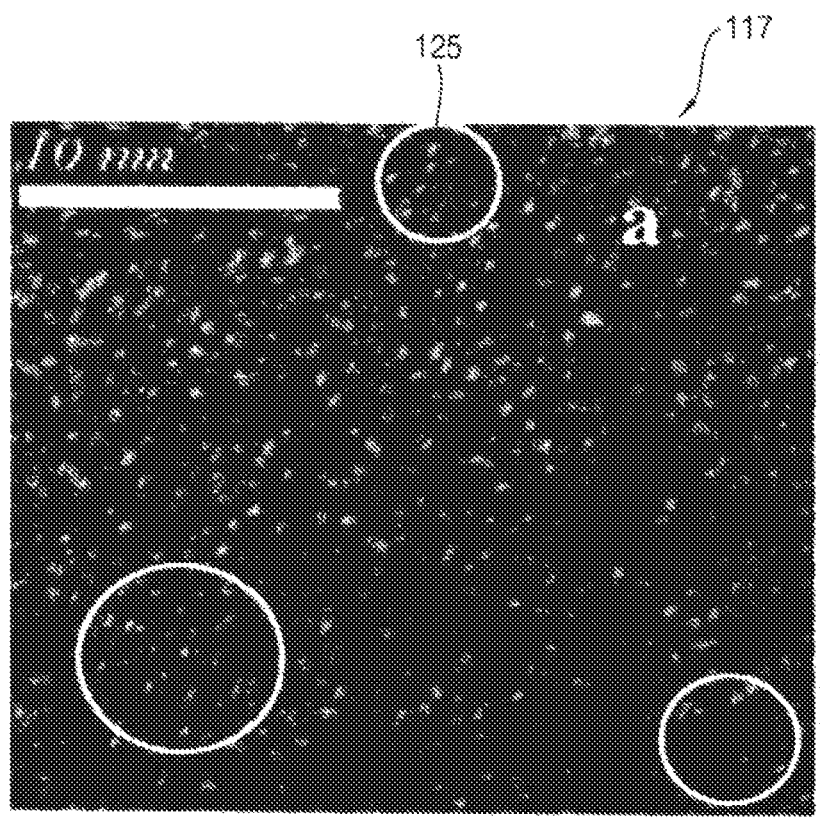
FIG. 4 is a photograph taken of a portion of a second channel layer of FIG. 2 by an electron microscope.

FIG. 1 is a perspective view illustrating a liquid crystal display apparatus according to an example embodiment. FIG. 2 is an enlarged plan view partially illustrating the liquid crystal display apparatus of FIG. 1. FIG. 3 is a cross-sectional view cut along the line I-I'. FIG. 4 is a photograph taken of a portion of a second channel layer of FIG. 2 by an electron microscope.

Referring to FIGS. 1 through 4, a liquid crystal display apparatus includes a first substrate 110, a second substrate 150 and a liquid crystal layer 170. The liquid crystal display apparatus 100 may be electrically coupled to a driving part 300. The driving part 300 may include a gate driving part 330 and a data driving part 310.

The second substrate 150 may face the first substrate 110. The liquid crystal layer 170 may be disposed between the first substrate 110 and the second substrate 150. The second substrate 150 may include a color filter (not shown). The color filter may be disposed on the first substrate 110. In addition, the second substrate 150 may include a pixel common electrode (not shown) to form a vertical electric field with the pixel electrode PE disposed on the first substrate 110. In addition, the pixel common electrode may be disposed on the first substrate 110 to form a horizontal electric field with the pixel electrode PE. A slit pattern may be formed in the pixel electrode PE or the pixel common electrode.

The first substrate 110 may include a base substrate 101, a gate electrode GE, a gate line GL, a gate insulation layer 103, an active pattern 113, a source electrode SE, a drain electrode DE, a data line DL, an insulation layer 105 and a pixel electrode PE.

The gate line GL may extend in a first direction D1, and be arranged in a second direction D2 which crosses the first direction D1. The data line DL may extend in the second direction D2, and be arranged in the first direction D1.

The base substrate 101 includes a transparent insulating material. For example, the base substrate 101 may include glass, quartz, and/or plastic. For example, the base substrate 101 may include polyethylene terephthalate resin, polyethylene resin, polycarbonate resin and the like.

The gate electrode GE is disposed on the base substrate 101. The gate electrode GE may be electrically coupled to the gate line GL. A gate signal from the gate driving part 330 may be applied to the gate electrode GE. The gate electrode GE may include aluminum (Al), titanium (Ti), copper (Cu), molybdenum (Mo), tantalum (Ta), tungsten (W), neodymium (Nd), chrome (Cr), silver (Ag), copper oxide (CuOx) and etc. In addition, the gate electrode GE may include gallium doped zinc oxide (GZO), indium doped zinc oxide (IZO), copper-manganese (CuMn) and etc.

The gate insulation layer 103 is disposed on the base substrate 101 on which the gate electrode GE is formed. The gate insulation layer 103 may include transparent insulation material such as silicon oxide (SiOx), silicon nitride (SiNx) and etc.

The active pattern 113 may be disposed on the gate insulation layer 103. At least a portion of the active pattern 113 may overlap the gate electrode GE. The active pattern 113 may include indium (In), zinc (Zn), gallium (Ga), tin (Sn), hafnium (Hf) and the like. For example, the active pattern 113 may be an oxide semiconductor pattern including indium gallium zinc oxide (IGZO), indium tin zinc oxide (ITZO), hafnium indium zinc oxide (HIZO) and etc.

More specifically, referring to FIG. 3, the active pattern 113 may include a first channel layer 115 contacting with the source electrode SE and the drain electrode DE and a second channel layer 117 disposed between the gate electrode GE and the first channel layer 115.

In example embodiments, a top surface a side surface of the second channel layer 117 may be covered and surrounded by the first channel layer 115.

In addition, the second channel layer 117 may include a plurality of high electron mobility regions 125. An electron mobility of each of the high electron mobility regions 125 may be greater than an electron mobility of the first channel layer 115.

For example, each of the high electron mobility regions may include polysilicon. In addition, a diameter of each of the high electron mobility regions 125 may be within about 1 nm to about 10 nm.

As illustrated in FIG. 4, the second channel layer 117 may include the high electron mobility regions 125 spaced apart from each other. Each of the high electron mobility regions 125 may include polysilicon. A remaining region of the second channel layer 117 except the high electron mobility regions 125 may include amorphous silicon. The remaining region of the second channel layer 117 may include substantially the same material as a material of the first channel layer 115.

In example embodiments, each of the high electron mobility regions 125 may be surrounded by the amorphous silicon.

A hydrogen content of each of the high electron mobility regions 125 may be greater than a hydrogen content of the first channel layer 115. A thickness of the second channel layer 117 may be within a range of about 250 angstrom to about 300 angstrom.

In example embodiments, the channel, that is the active pattern 113 may be disposed on the gate electrode GE. The thin film transistor according to example embodiments may have a bottom gate type. Alternatively, the active pattern 113 may be disposed under the gate electrode GE such that the thin film transistor may have a top gate type.

The source electrode SE is disposed on the gate insulation layer 103 to overlap a first side of the active pattern 113. The source electrode SE may be electrically coupled to the date line DL. Data voltage may be applied to the source electrode SE from the data driving part 310.

The drain electrode DE is spaced apart form source electrode SE. The drain electrode DE is disposed on the gate insulation layer 103 to overlap a second side of the active pattern 113.

The source electrode SE and the drain electrode DE may include aluminum (Al), titanium (Ti), copper (Cu), molybdenum (Mo), tantalum (Ta), tungsten|(W), neodymium (Nd), Chrome (Cr), Silver (Ag) and etc.

The insulation layer 105 is disposed on the base substrate 101 on which the source electrode SE and the drain electrode DE are formed. The insulation layer 105 may include substantially the same material as the gate insulation layer 103.

The pixel electrode PE is electrically coupled to the drain electrode DE through a contact hole (not shown) which is defined at the insulation layer 105. The pixel electrode PE may include a transparent conductive material. For example, the pixel electrode PE may include indium zinc oxide (IZO), indium tin oxide (ITO), tin oxide (SnOx), zinc oxide (ZnOx) and etc.

According to the thin film transistor in accordance with example embodiments, the thin film transistor may have higher electron mobility.

Electric characteristic of the thin film transistor may be enhanced, and percent defective may decrease.

FIGS. 5 to 13 are cross-sectional views illustrating a method of manufacturing a thin film transistor according to example embodiments.

Figure 5:
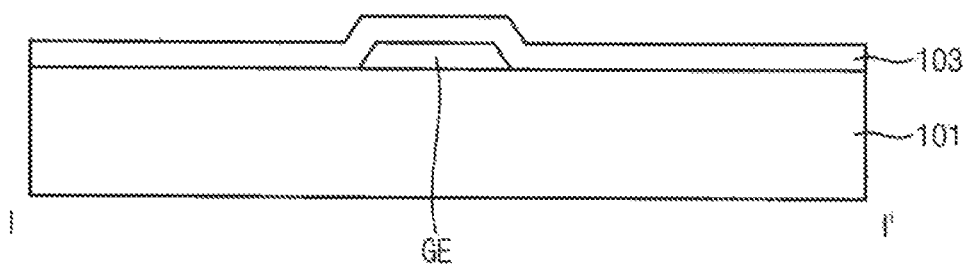
FIGS. 5 to 13 are cross-sectional views illustrating a method of manufacturing a thin film transistor according to example embodiments.

Referring to FIG. 5, a gate electrode GE is formed on a base substrate 101. A gate insulation layer 103 is formed on the base substrate 101 on which the gate electrode GE is formed.

The gate electrode GE may be formed to include aluminum (Al), titanium (Ti), copper (Cu), molybdenum (Mo), tantalum (Ta), tungsten (W), neodymium (Nd), Chrome (Cr), Silver (Ag), copper oxide (CuOx) and etc. The gate electrode GE may be formed to include gallium doped zinc oxide (GZO), indium doped zinc oxide (IZO), copper-manganese alloy (CuMn) and etc.

The gate insulation layer 103 may be formed to include a transparent insulative material such as silicon oxide (SiOx), silicon nitride (SiNx) and etc.

Figure 6:
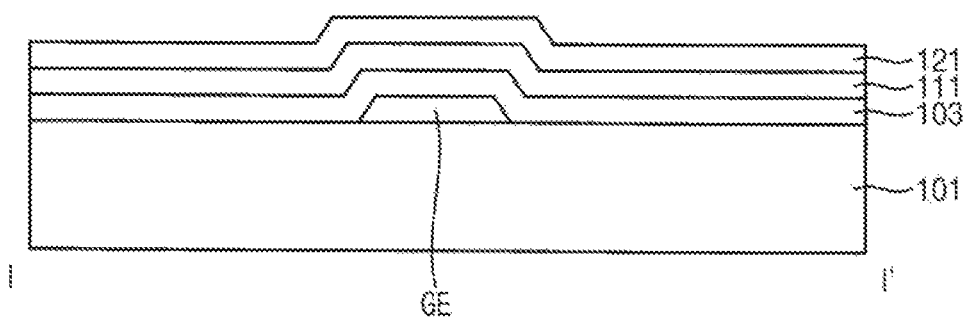

Referring to FIG. 6, an active layer 111 is formed on the gate insulation layer 103. A data metal layer 121 is formed on the active layer 111.

The active layer 111 may be formed to include indium (In), zinc (Zn), gallium (Ga), tin (Sn), hafnium (Hf) and etc. For example, the active layer 111 may be formed to include an oxide semiconductor layer including indium gallium zinc oxide (IGZO), indium tin zinc oxide (ITZO), hafnium indium zinc oxide (HIZO) and etc.

The data metal layer 121 may be formed to include aluminum (Al), titanium (Ti), copper (Cu), molybdenum (Mo), tantalum (Ta), tungsten|(W), neodymium (Nd), Chrome (Cr), Silver (Ag) and etc.

Figure 7:
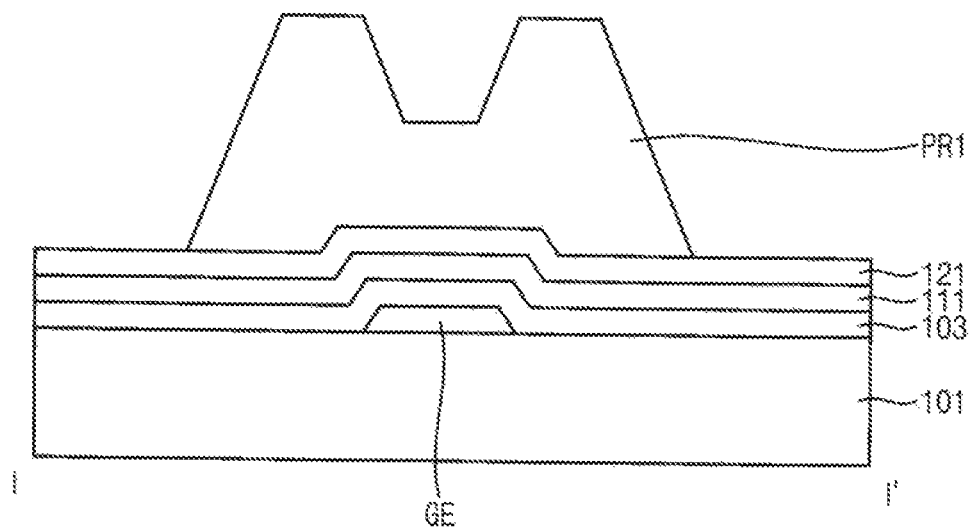

Referring to FIG. 7, a first photoresist pattern PR1 is formed on the data metal layer 121. The first photoresist pattern PR1 may overlap the gate electrode GE. The first photoresist pattern PR1 may be thinner at a portion which overlaps the gate electrode than the other portion.

Figure 8:
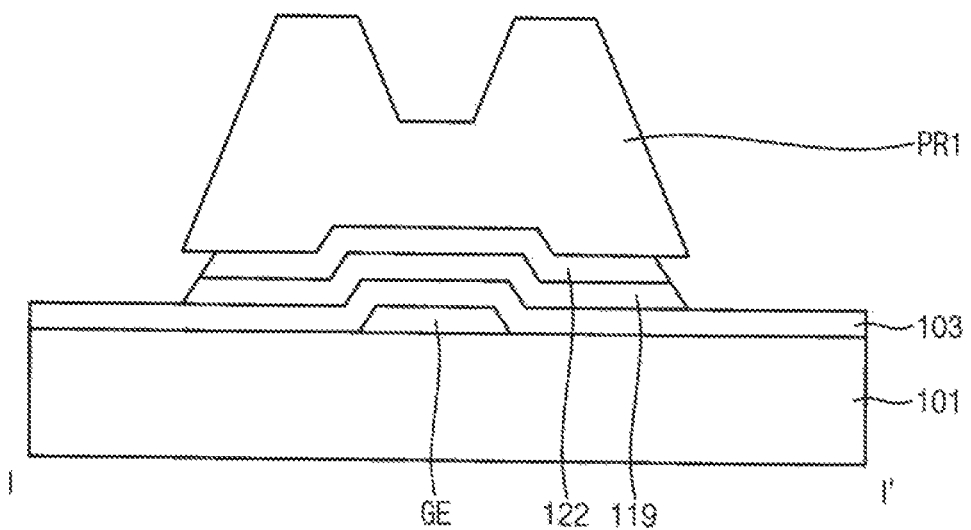

Referring to FIG. 8, the active layer 111 and the data metal layer 121 are etched using the first photoresist pattern PR1 as a etch stop layer so that the data metal layer 121 may be transformed into a data metal pattern 122 and the active layer 111 may be transformed into a preliminary active pattern 119.

For example, the data metal layer 121 and the active layer 111 may be wet-etched using the first photoresist pattern PR1 as a etch stop layer.

Figure 9:
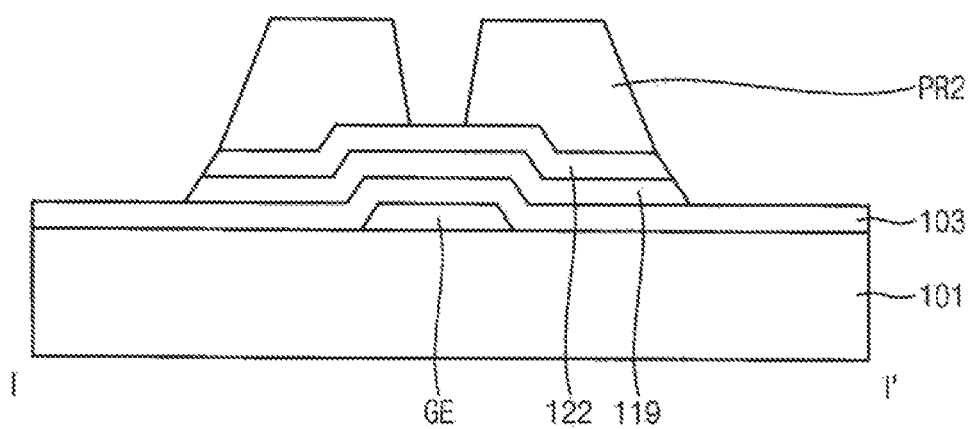

Referring to FIG. 9, a second photoresist pattern PR2 is formed by partially removing the first photoresist pattern PR1. The second photoresist pattern PR2 may be formed by partially removing the first photoresist pattern PR1 in a thickness direction.

An upper surface of the data metal pattern 122 may be partially exposed by the second photoresist pattern PR2. For example, a central portion of the upper surface of the data metal pattern 122 may be exposed.

Figure 10:
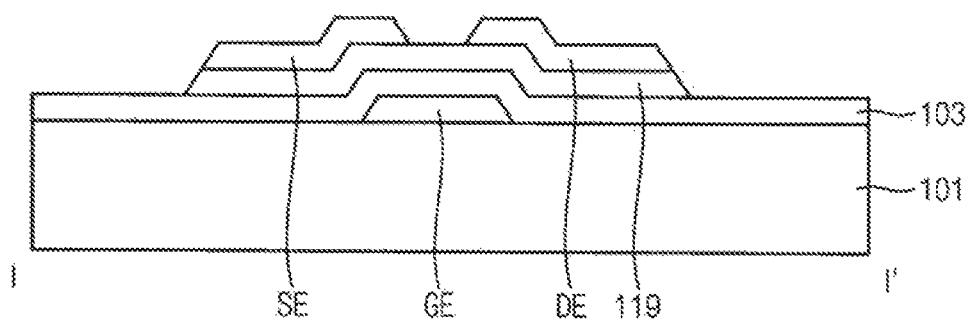

Referring to FIG. 10, the data metal pattern 122 is etched using the second photoresist pattern PR2 as an etch stop layer. An exposed portion of the data metal pattern 122 is etched to form a source electrode SE and a drain electrode DE.

The data metal pattern 122 may be transformed into the source electrode SE and the drain electrode DE.

Figure 11:
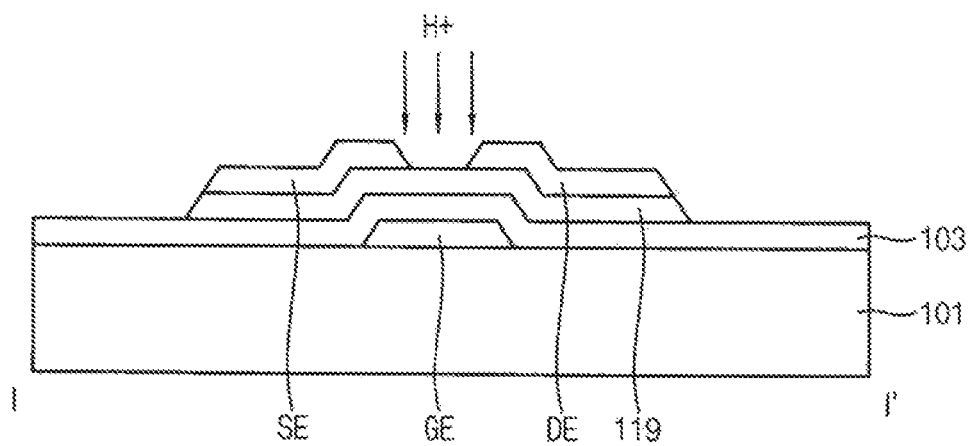

Referring to FIG. 11, a hydrogen ion beam is implanted at a portion of the preliminary active pattern 119 not covered by the source electrode SE and the drain electrode DE. An annealing process is performed at the preliminary active pattern 119.

The hydrogen ion beam may be accelerated with a range of about 10 keV to about 30 keV to be implanted at the portion of the preliminary active pattern 119. In addition, the annealing process may be performed within a range of about 250 degree Celsius to about 300 degree Celsius.

Figure 12:
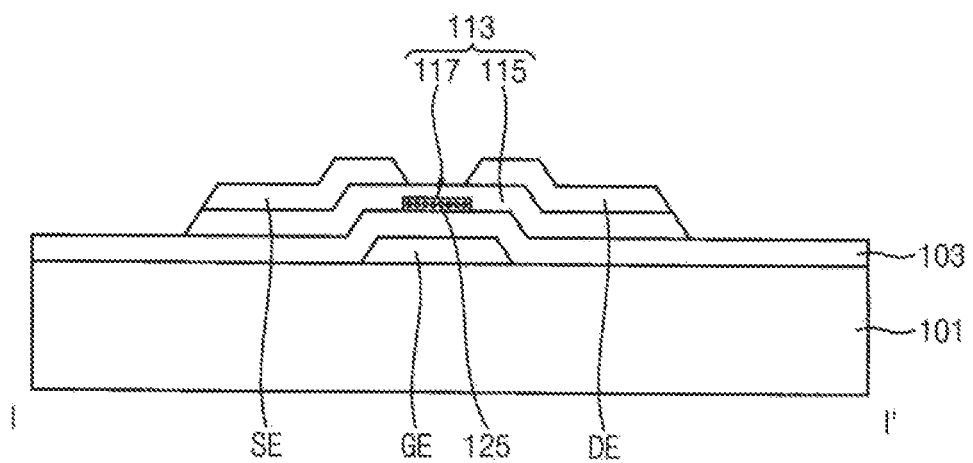

Referring to FIG. 12, the preliminary active pattern 119 is transformed into an active pattern 113 by the hydrogen ion beam implantation process and the annealing process.

The active pattern 113 may be formed to include a first channel layer 115 contacting with the source electrode SE and the drain electrode DE and a second channel layer 117 disposed between the gate electrode GE and the first channel layer 115.

For example, the portion of the preliminary active pattern 119 at which the hydrogen ion beam is implanted may be transformed into the second channel layer 117. A remaining portion of the preliminary active pattern 119 at which the hydrogen ion beam is not implanted may be transformed into the first channel layer 115.

In example embodiments, a top surface and a side surface of the second channel layer 117 may be surrounded and covered by the first channel layer 115.

In addition, the second channel layer 117 may be formed to have a plurality of high electron mobility regions 125. An electron mobility of each of the high electron mobility regions 125 may be greater than an electron mobility of the first channel layer 115.

For example, amorphous silicon included in the portion of the preliminary active pattern 119 at which the hydrogen ion beam in implanted may be transformed into polysilicon to form the electron mobility regions 125.

A diameter of each of the high electron mobility regions 125 may be within a range of about 1 nm to about 10 nm.

In addition, a hydrogen content of each of the high electron mobility regions 125 may be greater than a hydrogen content of the first channel layer 115. A thickness of the second channel layer 117 may be within a range of about 250 angstrom to about 300 angstrom.

Figure 13:
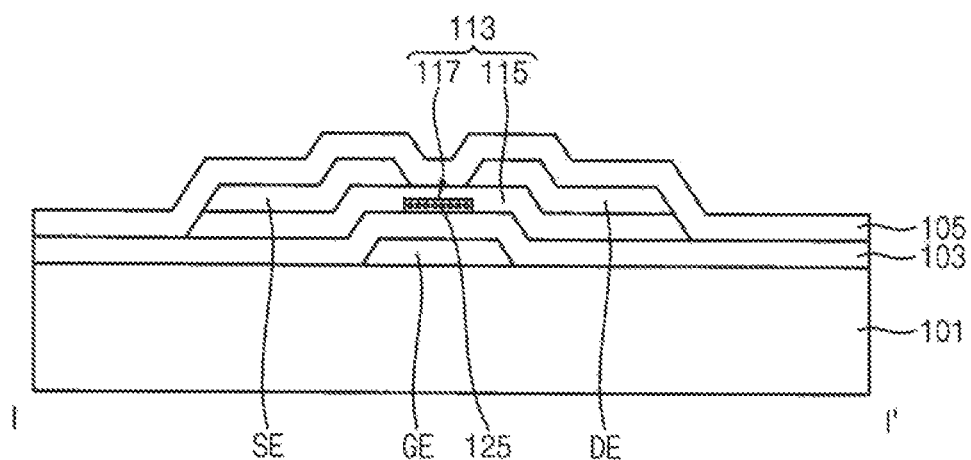

Referring to FIG. 13, an insulation layer 105 is formed on the base substrate 101 on which the source electrode SE and the drain electrode DE are formed. The insulation layer 105 may generally cover the source electrode SE and the drain electrode DE.

According to the method of a thin film transistor in accordance with example embodiments, a thin film transistor having high electron mobility can be manufactured.

Electric characteristic of the thin film transistor may be enhanced, and percent defective may decrease.

In addition, a hydrogen ion beam implantation process and an annealing process may be only added to a conventional amorphous silicon transistor manufacturing process to manufacture the thin film transistor according to example embodiments such that productivity and process efficiency increase.

FIGS. 14 to 21 are cross-sectional views illustrating a method of manufacturing a thin film transistor according to example embodiments. The method of manufacturing a thin film transistor may be substantially the same as that of FIGS. 5 to 13, except that a hydrogen ion beam implantation process and an annealing process are performed after forming an insulation layer. Detailed descriptions on processes and materials substantially the same as or similar to those illustrated with reference to FIGS. 5 to 13 are omitted herein.

Figure 14:
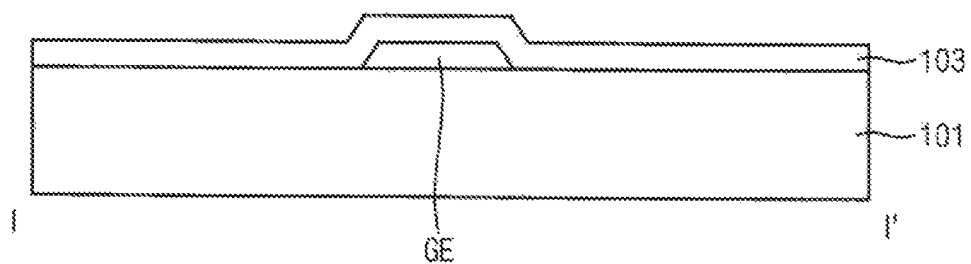
FIGS. 14 to 21 are cross-sectional views illustrating a method of manufacturing a thin film transistor according to example embodiments.

Referring to FIG. 14, a gate electrode GE is formed on a base substrate 101. A gate insulation layer 103 is formed on the base substrate 101 on which the gate electrode GE is formed.

The gate insulation layer 103 may be formed to include a transparent insulative material such as silicon oxide (SiOx), silicon nitride (SiNx) and etc.

Figure 15:
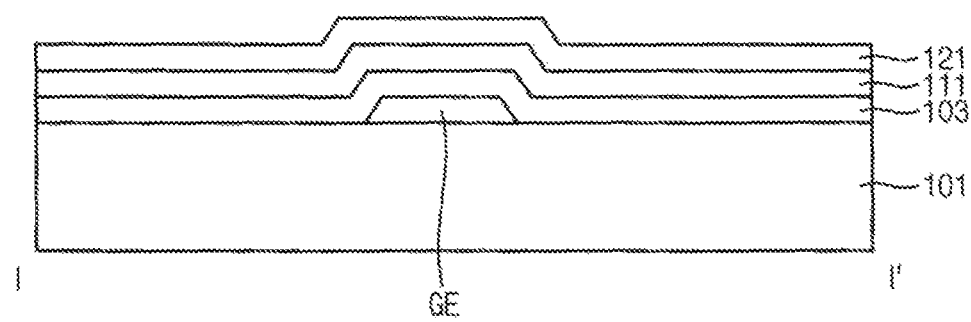

Referring to FIG. 15, an active layer 111 is formed on the gate insulation layer 103. A data metal layer 121 is formed on the active layer 111.

Figure 16:
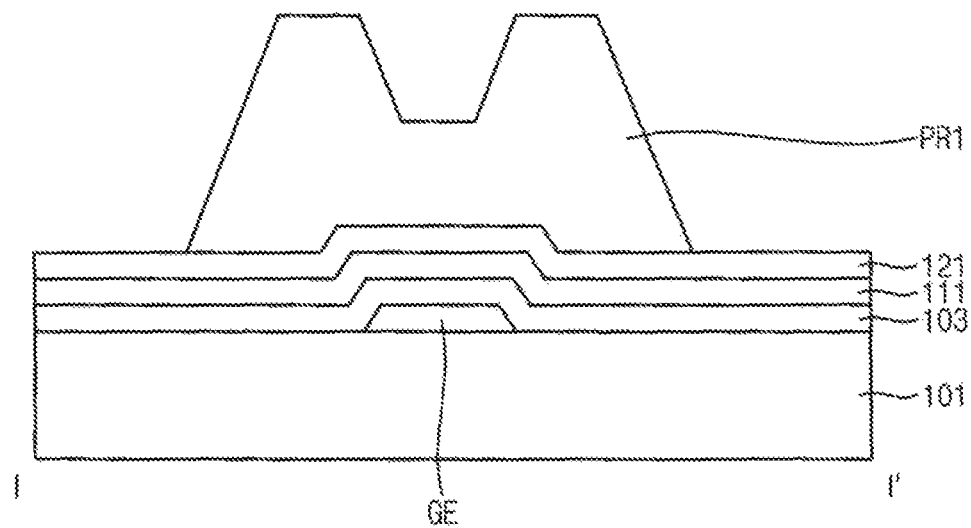

Referring to FIG. 16, a first photoresist pattern PR1 is formed on the data metal layer 121. The first photoresist pattern PR1 may overlap the gate electrode GE. The first photoresist pattern PR1 may have a smaller thickness at a portion which overlaps the gate electrode than a thickness of other portion.

Figure 17:
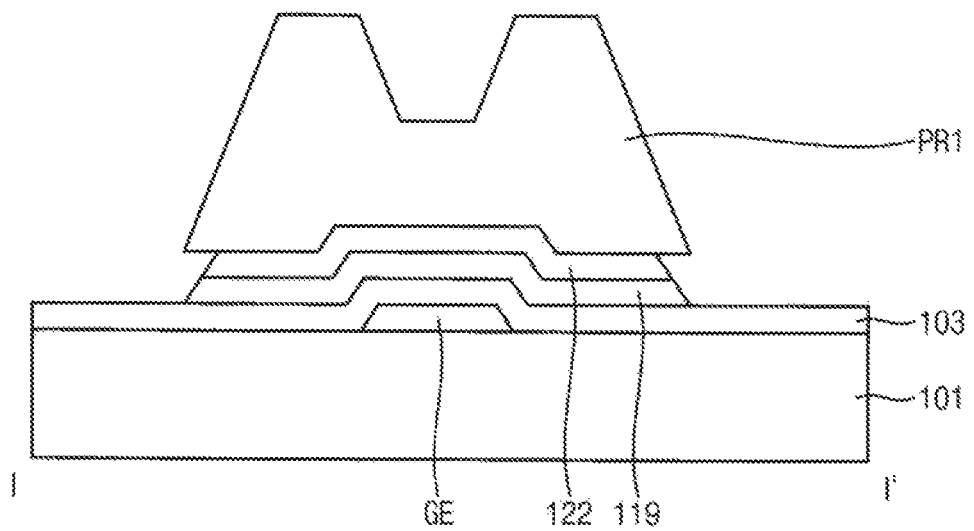

Referring to FIG. 17, the active layer 111 and the data metal layer 121 are etched using the first photoresist pattern PR1 as etch stop layer so that the data metal layer 121 may be transformed into a data metal pattern 122 and the active layer 111 may be transformed into a preliminary active pattern 119.

For example, the data metal layer 121 and the active layer 111 may be wet-etched using the first photoresist pattern PR1 as etch stop layer.

Figure 18:
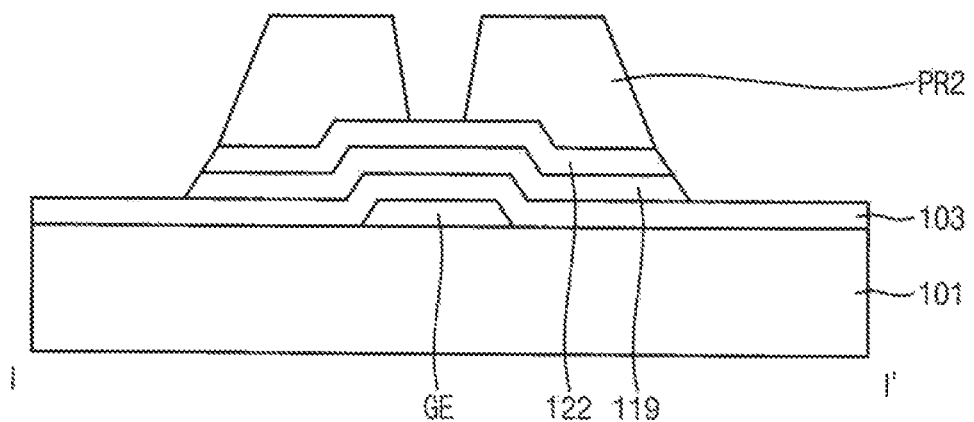

Referring to FIG. 18, a second photoresist pattern PR2 is formed by partially removing the first photoresist pattern PR1. The second photoresist pattern PR2 may be formed by partially removing the first photoresist pattern PR1 in a thickness direction. An upper surface of the data metal pattern 122 may be partially exposed by the second photoresist pattern PR2. For example, a central portion of the upper surface of the data metal pattern 122 may be exposed.

Figure 19:
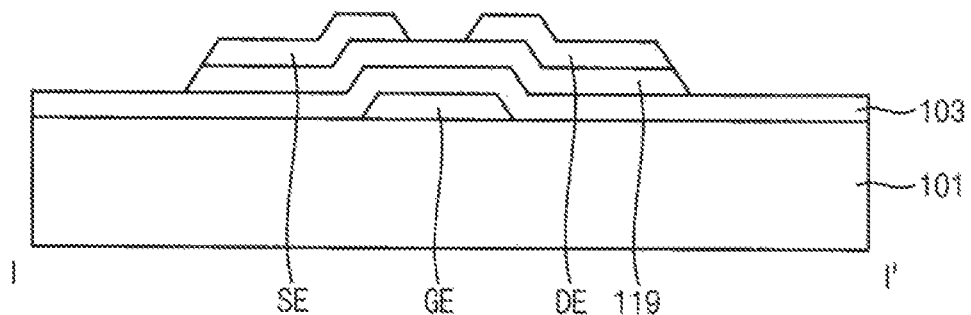

Referring to FIG. 19, the data metal pattern 122 is etched using the second photoresist pattern PR2 as etch stop layer. An exposed portion of the data metal pattern 122 is etched so that a source electrode SE and a drain electrode DE may be formed.

The data metal pattern 122 may be transformed into the source electrode SE and the drain electrode DE.

Figure 20:
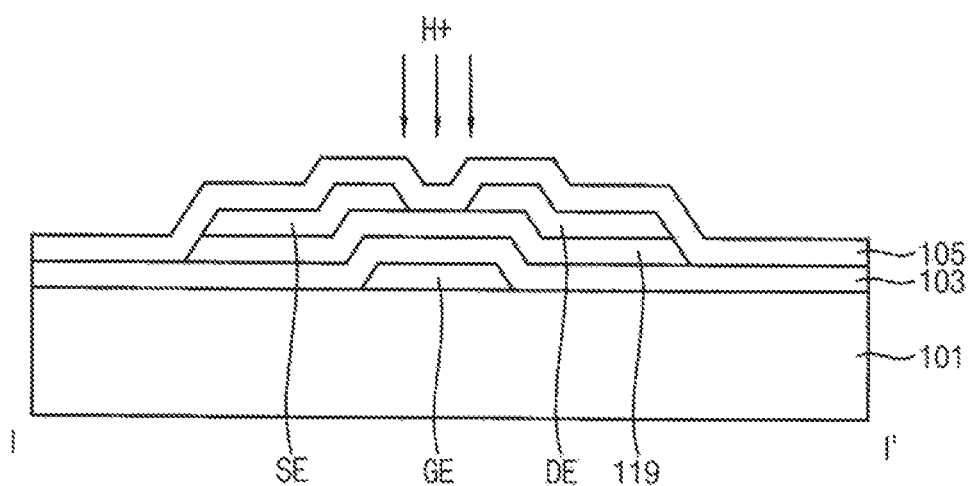

Referring to FIG. 20, an insulation layer 105 is formed on the base substrate 101 on which the source electrode SE and the drain electrode DE are formed. A hydrogen ion beam is implanted at a portion of the preliminary active pattern 119 not covered by the source electrode SE and the drain electrode DE. An annealing process is performed at the preliminary active pattern 119.

The insulation layer 105 may be formed to cover the source electrode SE, the drain electrode DE and the preliminary active pattern 119.

The hydrogen ion beam may be accelerated with a range of about 10 keV to about 30 keV to be implanted at the portion of the preliminary active pattern 119. In addition, the annealing process may be performed within a range of about 250 degree Celsius to about 300 degree Celsius.

Figure 21:
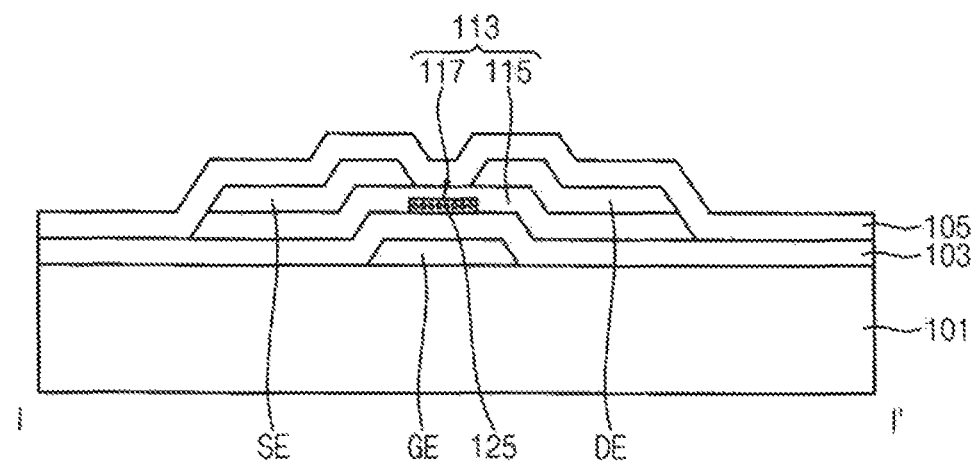

Referring to FIG. 21, the preliminary active pattern 119 is transformed into an active pattern 113 by the hydrogen ion beam implantation process and the annealing process.

The active pattern 113 may be formed to include a first channel layer 115 contacting with the source electrode SE and the drain electrode DE and a second channel layer 117 disposed between the gate electrode GE and the first channel layer 115.

For example, the portion of the preliminary active pattern 119 at which the hydrogen ion beam is implanted may be transformed into the second channel layer 117. A remaining portion of the preliminary active pattern 119 at which the hydrogen ion beam is not implanted may be transformed into the first channel layer 115.

In example embodiments, a top surface and a side surface of the second channel layer 117 may be surrounded and covered by the first channel layer 115.

In addition, the second channel layer 117 may be formed to have a plurality of high electron mobility regions 125. An electron mobility of each of the high electron mobility regions 125 may be greater than an electron mobility of the first channel layer 115.

For example, amorphous silicon included in the portion of the preliminary active pattern 119 at which the hydrogen ion beam is implanted may be transformed into polysilicon to form the electron mobility regions 125.

According to the method of manufacturing a thin film transistor in accordance with example embodiments, a thin film transistor having high electron mobility can be manufactured.

Electric characteristic of the thin film transistor may be enhanced, and percent defective may decrease.

In addition, because a hydrogen ion beam implantation process and an annealing process are performed after forming the insulation layer 105, a conventional amorphous silicon transistor manufacturing process and a conventional amorphous silicon transistor manufacturing facility can be used.

Figure 22:
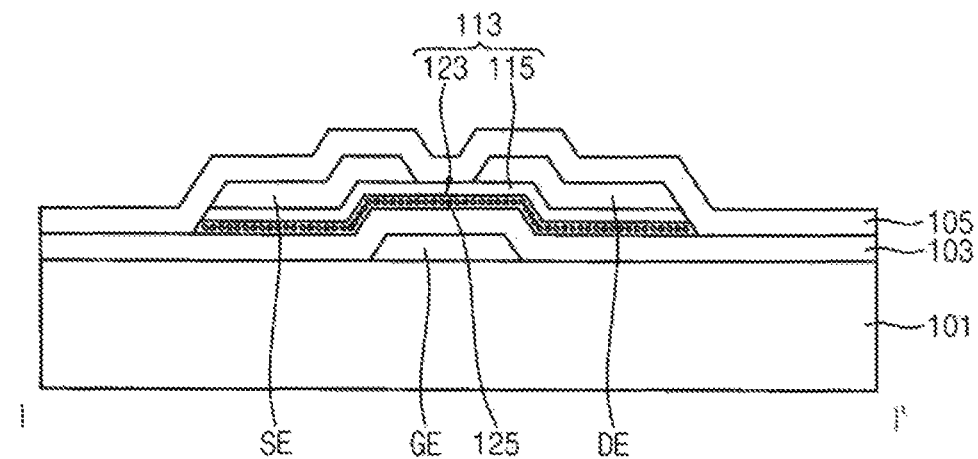
FIG. 22 is a cross-section view illustrating a thin film transistor according to example embodiments.

FIG. 22 is a cross-section view illustrating a thin film transistor according to another example embodiment. The thin film transistor may be substantially the same as that of FIGS. 1 to 4, except for a third channel layer. Thus, like reference numerals refer to like elements, and repetitive explanations thereon may be omitted herein.

Referring FIGS. 1, 2 and 22, a liquid crystal display apparatus includes a first substrate 110, a second substrate 150 and a liquid crystal layer 170. The liquid crystal display apparatus 100 may be electrically coupled to a driving part 300. The driving part 300 may include a gate driving part 330 and a data driving part 310.

The first substrate 110 may include a base substrate 101, a gate electrode GE, a gate line GL, a gate insulation layer 103, an active pattern 113, a source electrode SE, a drain electrode DE, a data line DL, an insulation layer 105 and a pixel electrode PE.

The base substrate 101 includes a transparent insulating material. For example, the base substrate 101 may include glass, quartz, and/or plastic.

The gate electrode GE is disposed on the base substrate 101. The gate electrode GE may be electrically coupled to the gate line GL. A gate signal from the gate driving part 330 may be applied to the gate electrode GE.

The gate insulation layer 103 is disposed on the base substrate 101 on which the gate electrode GE is formed. The gate insulation layer 103 may include transparent insulation material such as silicon oxide (SiOx), silicon nitride (SiNx) and etc.

The active pattern 113 may be disposed on the gate insulation layer 103. At least a portion of the active pattern 113 may overlap the gate electrode GE.

The active pattern 113 may include a first channel layer 115 contacting with the source electrode SE and the drain electrode DE and a third channel layer 123 disposed between the gate electrode GE and the first channel layer 115.

In example embodiments, the third channel layer 123 may be disposed under the first channel layer 115. A top surface of the first channel layer 115 may contact with the source electrode SE, the drain electrode DE and the insulation layer 105. A side surface of the third channel layer 123 may contact with the insulation layer 105.

In addition, the third channel layer 123 may include a plurality of high electron mobility regions 125. An electron mobility of each of the high electron mobility regions 125 may be greater than an electron mobility of the first channel layer 115.

For example, each of the high electron mobility regions 125 may include polysilicon. In addition, a diameter of each of the high electron mobility regions 125 may be within about 1 nm to about 10 nm.

In example embodiments, each of the high electron mobility regions 125 may be surrounded by the amorphous silicon.

A hydrogen content of each of the high electron mobility regions 125 may be greater than a hydrogen content of the first channel layer 115. A thickness of the third channel layer 123 may be within a range of about 250 angstrom to about 300 angstrom.

In example embodiments, the channel, that is the active pattern 113 may be disposed on the gate electrode GE. The thin film transistor according to example embodiments may have a bottom gate type. Alternatively, the active pattern 113 may be disposed under the gate electrode GE such that the thin film transistor may have a top gate type.

The source electrode SE is disposed on the gate insulation layer 103 to overlap a first side of the active pattern 113. The source electrode SE may be electrically coupled to the data line DL. Data voltage may be applied to the source electrode SE from the data driving part 310.

The drain electrode DE is spaced apart from source electrode SE. The drain electrode DE is disposed on the gate insulation layer 103 to overlap a second side of the active pattern 113.

The insulation layer 105 is disposed on the base substrate 101 on which the source electrode SE and the drain electrode DE are formed. The insulation layer 105 may include substantially the same material as the gate insulation layer 103.

The pixel electrode PE is electrically coupled to the drain electrode DE through a contact hole (not shown) which is defined at the insulation layer 105. The pixel electrode PE may include a transparent conductive material.

According to the thin film transistor in accordance with example embodiments, the thin film transistor may have high electron mobility.

Electric characteristic of the thin film transistor may be enhanced, and percent defective may decrease.

In particular, the high electron mobility regions 125 may be disposed under the source electrode SE and the drain electrode DE such that the thin film transistor according to example embodiments has high electron mobility.

FIGS. 23 to 29 are cross-sectional views illustrating a method of manufacturing a thin film transistor according to example embodiments. The method of manufacturing a thin film transistor may be substantially the same as that of FIGS. 5 to 13, except that a hydrogen ion beam implantation process and an annealing process are performed after forming an active layer. Detailed descriptions on processes and materials substantially the same as or similar to those illustrated with reference to FIGS. 5 to 13 are omitted herein.

Figure 23:
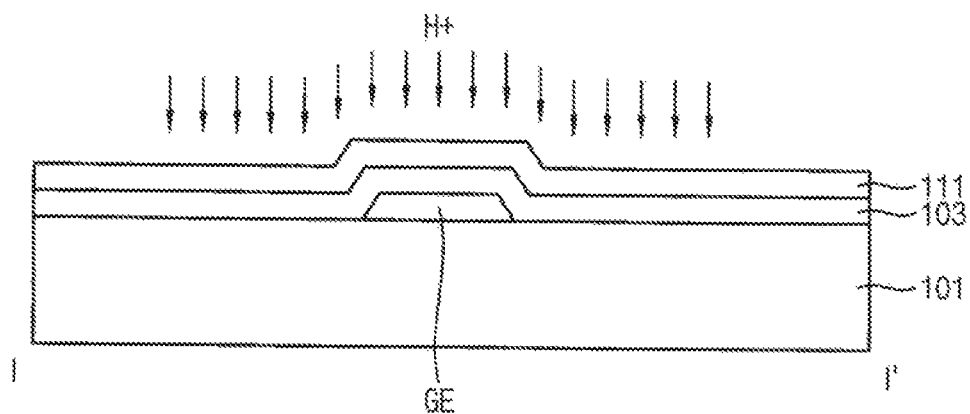
FIGS. 23 to 29 are cross-sectional views illustrating a method of manufacturing a thin film transistor according to example embodiments.

Referring to FIG. 23, a gate electrode GE is formed on a base substrate 101. A gate insulation layer 103 is formed on the base substrate 101 on which the gate electrode GE is formed. An active layer 111 is formed on the gate insulation layer 103. A hydrogen beam is implanted at the active layer 111 and an annealing process is performed.

In example embodiments, the hydrogen beam may be incident on an entire upper surface of the active layer 111.

The hydrogen ion beam may be accelerated within a range of about 10 keV to 30 keV to be implanted at the active layer 111. In addition, the annealing process may be performed within a range of about 250 degree Celsius to about 300 degree Celsius.

Figure 24:
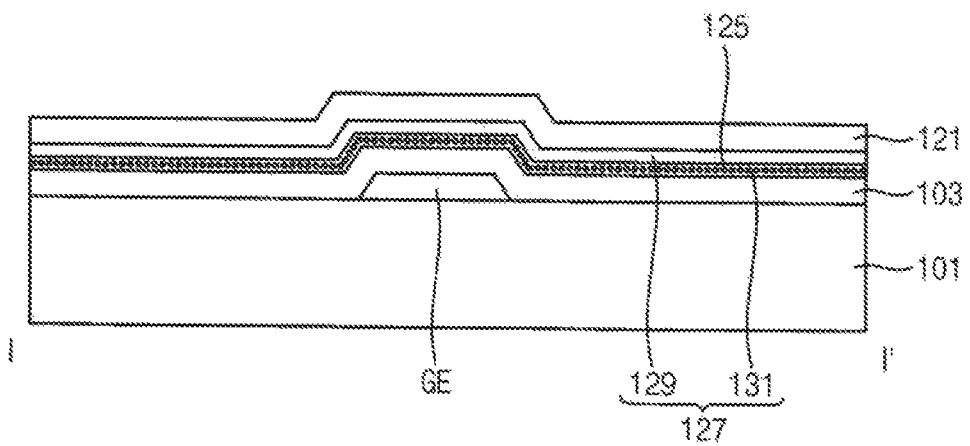

Referring to FIG. 24, the active layer 111 may be transformed into a preliminary active layer 127 by the hydrogen ion beam implantation process and the annealing process. A data metal layer 121 is formed on the preliminary active layer 127.

In addition, the preliminary active layer 127 may be formed to include a first preliminary channel layer 129 contacting with the data metal layer 121 and a second preliminary channel layer 131 disposed between the gate electrode GE and the first preliminary channel layer 129.

The second preliminary channel layer 131 may be formed to have a plurality of high electron mobility regions 125. An electron mobility of each of the high electron mobility regions 125 may be greater than an electron mobility of the first preliminary channel layer 129.

For example, amorphous silicon included in a portion of the active layer 111 at which the hydrogen ion beam is implanted may be transformed into polysilicon to form the electron mobility regions 125.

Figure 25:
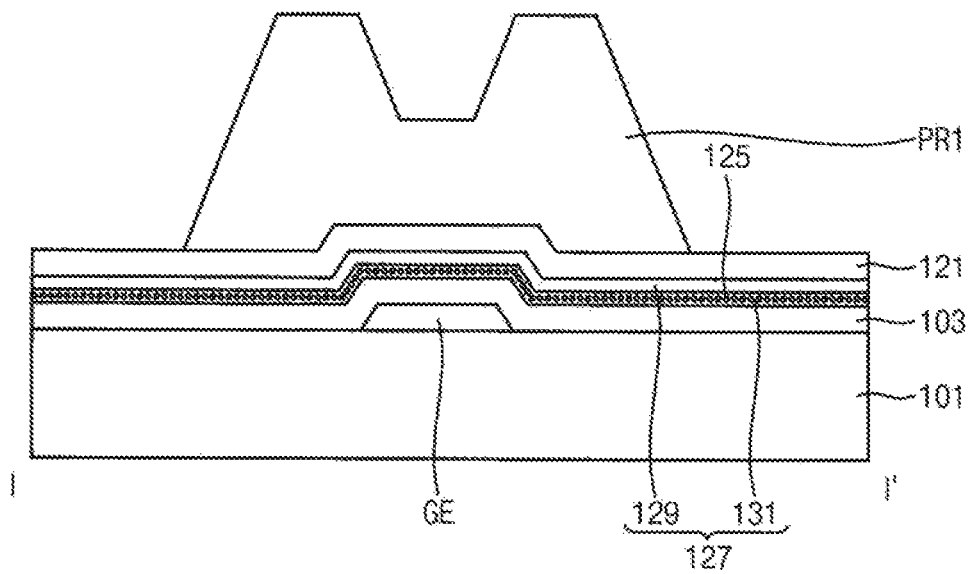

Referring to FIG. 25, a first photoresist pattern PR1 is formed on the data metal layer 121. The first photoresist pattern PR1 may overlap the gate electrode GE. The first photoresist pattern PR1 may be thinner at a portion which overlaps the gate electrode than other portion.

Figure 26:
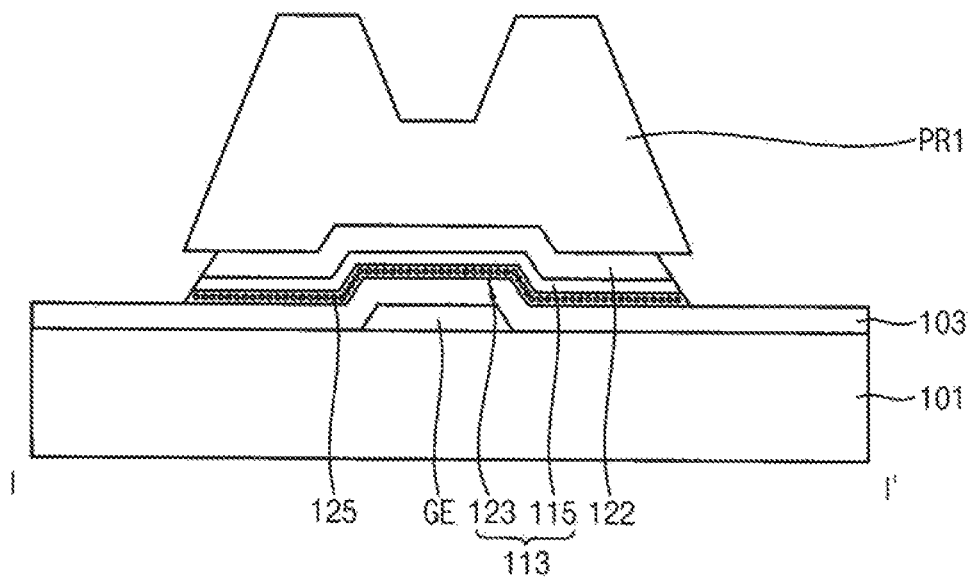

Referring to FIG. 26, the preliminary active layer 127 and the data metal layer 121 are etched using the first photoresist pattern PR1 as etch stop layer so that the data metal layer 121 may be transformed into a data metal pattern 122 and the preliminary active layer 127 may be transformed into an active pattern 113.

For example, the data metal layer 121 and the preliminary active layer 127 may be wet-etched using the first photoresist pattern PR1 as etch stop layer.

By the etching process, the first preliminary channel layer 129 may be transformed into a first channel layer 115, and the second preliminary channel layer 131 may be transformed into a third channel layer 123.

Figure 27:
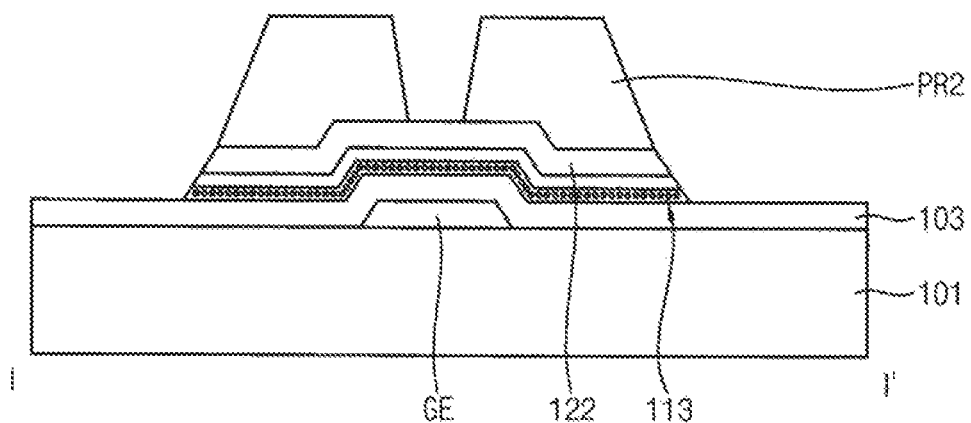

Referring to FIG. 27, a second photoresist pattern PR2 is formed by partially removing the first photoresist pattern PR1. The second photoresist pattern PR2 may be formed by partially removing the first photoresist pattern PR1 in a thickness direction. An upper surface of the data metal pattern 122 may be partially exposed by the second photoresist pattern PR2. For example, a central portion of the upper surface of the data metal pattern 122 may be exposed.

Figure 28:
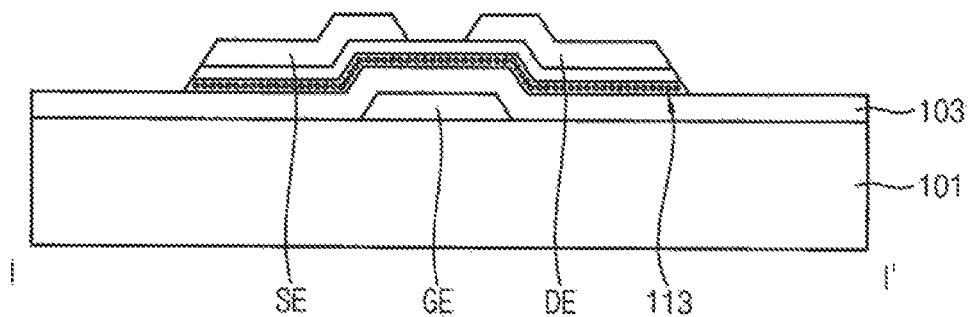

Referring to FIG. 28, the data metal pattern 122 is etched using the second photoresist pattern PR2 as etch stop layer. An exposed portion of the data metal pattern 122 is etched so that a source electrode SE and a drain electrode DE may be formed.

The data metal pattern 122 may be transformed into the source electrode SE and the drain electrode DE.

Figure 29:
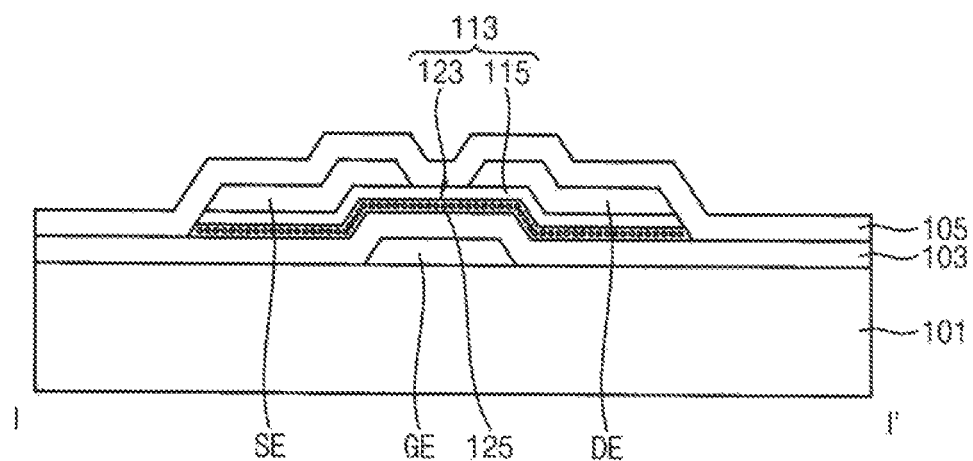

Referring to FIG. 29, an insulation layer 105 is formed on the base substrate 101 on which the source electrode SE and the drain electrode DE are formed.

The insulation layer 105 may be formed to cover the source electrode SE, the drain electrode DE and the active pattern 113.

According to the method of manufacturing a thin film transistor in accordance with example embodiments, a thin film transistor having high electron mobility can be manufactured.

Electric characteristic of the thin film transistor may be enhanced, and percent defective may decrease.

In addition, because a hydrogen ion beam implantation process and an annealing process are performed after forming the active layer 111, a manufacturing process of the thin film transistor according to example embodiments may become simple.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present inventive concept. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A thin film transistor, comprising:
 a substrate;
 a gate electrode disposed on the substrate;
 a gate insulation layer disposed on the gate electrode;
 an active pattern disposed on the gate insulation layer;
 a source electrode electrically coupled to the active pattern; and
 a drain electrode electrically coupled to the active pattern,
 wherein the active pattern comprises:
  a first channel layer overlapping the source electrode and the drain electrode; and
  a second channel layer overlapping the gate electrode,
   wherein the second channel layer comprises at least three high electron mobility regions and amorphous silicon, the amorphous silicon being directly disposed on the gate insulation layer and each of the high electron mobility regions contacting the amorphous silicon without contacting the gate insulation layer,
  wherein an electron mobility of each of the high electron mobility regions is greater than an electron mobility of the first channel layer, and
  wherein each of the high electron mobility regions includes polysilicon.

2. The thin film transistor of claim 1, wherein the high electron mobility regions are spaced apart from each other.

3. The thin film transistor of claim 1, wherein a diameter of each of the high electron mobility regions is within a range of about 1 nm to about 10 nm.

4. The thin film transistor of claim 1, wherein a hydrogen content of each of the high electron mobility regions is greater than a hydrogen content of the first channel layer.

5. The thin film transistor of claim 1, wherein a top surface and a side surface of the second channel layer are covered by the first channel layer.

6. The thin film transistor of claim 1, wherein the active pattern is disposed between the source/drain electrode and the gate electrode.

7. The thin film transistor of claim 1, wherein the high electron mobility regions overlap the gate electrode.

8. A liquid crystal display apparatus, comprising:
 a first substrate comprising a gate electrode, a gate insulation layer disposed on the gate electrode, an active pattern disposed on the gate insulation layer, a source electrode electrically coupled to the active pattern, a drain electrode electrically coupled to the active pattern and a pixel electrode electrically coupled to the drain electrode;
 a second substrate opposite to the first substrate; and
 a liquid crystal layer disposed between the first and second substrates,
 wherein the active pattern comprises:
 a first channel layer disposed between each of the source electrode, the drain electrode and the gate electrode; and
 a second channel layer disposed between the gate electrode and the first channel layer,
 wherein the second channel layer comprises at least three high electron mobility regions and amorphous silicon, the amorphous silicon being directly disposed on the gate insulation layer and each of the high electron mobility regions contacting the amorphous silicon without contacting the gate insulation layer,
 wherein an electron mobility of each of the high electron mobility regions is greater than an electron mobility of the first channel layer, and
  wherein each of the high electron mobility regions includes polysilicon.

9. The liquid crystal display apparatus of claim 8, wherein the high electron mobility regions are spaced apart from each other.

10. The liquid crystal display apparatus of claim 8, wherein a diameter of each of the high electron mobility regions is within a range of about 1 nm to about 10 nm.

11. The liquid crystal display apparatus of claim 8, wherein a hydrogen content of each of the high electron mobility regions is greater than a hydrogen content of the first channel layer.

12. The liquid crystal display apparatus of claim 8, wherein a top surface and a side surface of the second channel layer are covered by the first channel layer and an insulation layer respectively.

13. The liquid crystal display apparatus of claim 8, wherein the active pattern is disposed between the source/drain electrode and the gate electrode.

14. A method of manufacturing a thin film transistor, comprising:
　forming a gate electrode on a substrate;
　forming a gate insulation layer on the gate electrode;
　sequentially forming an active layer and a data metal layer on the gate insulation layer;
　forming a first photoresist pattern on the data metal layer;
　patterning the data metal layer into a data metal pattern and patterning the active layer into a preliminary active pattern using the first photoresist pattern as an etch stop layer;
　forming a second photoresist pattern by partially removing the first photoresist pattern,
　forming a source electrode and a drain electrode by patterning the data metal pattern using the second photoresist pattern as an etch stop layer; and
　forming an active pattern by performing a hydrogen ion beam implantation process and an annealing process at the preliminary active pattern,
　wherein the active pattern includes a first channel layer and a second channel layer,
　wherein the second channel layer includes at least three high electron mobility regions and amorphous silicon, the amorphous silicon being directly disposed on the gate insulation layer and each of the high electron mobility regions contacting the amorphous silicon without contacting the gate insulation layer,
　wherein an electron mobility of each of the high electron mobility regions is greater than an electron mobility of the first channel layer, and
　wherein each of the high electron mobility regions includes polysilicon.

15. The method of manufacturing a thin film transistor of claim 14, wherein performing the hydrogen ion beam implantation process further comprises:
　accelerating a hydrogen ion beam within a range of about 10 keV to about 30 key; and
　implanting the hydrogen ion beam at the preliminary active pattern.

16. The method of manufacturing a thin film transistor of claim 14, wherein performing the annealing process further comprises:
　annealing the preliminary active pattern within a range of about 250 degree Celsius to about 300 degree Celsius.

17. The method of manufacturing a thin film transistor of claim 14, further comprising:
　forming an insulation layer covering the preliminary active pattern, the source electrode and the drain electrode.

* * * * *